United States Patent
Michigami

(10) Patent No.: US 10,998,884 B2
(45) Date of Patent: May 4, 2021

(54) ACOUSTIC WAVE FILTER DEVICE

(71) Applicant: Murata Manufacturing Co., Ltd., Nagaokakyo (JP)

(72) Inventor: Akira Michigami, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 29 days.

(21) Appl. No.: 16/419,076

(22) Filed: May 22, 2019

(65) Prior Publication Data
US 2019/0273481 A1 Sep. 5, 2019

Related U.S. Application Data

(63) Continuation of application No. PCT/JP2017/042077, filed on Nov. 22, 2017.

(30) Foreign Application Priority Data

Nov. 25, 2016 (JP) .............................. JP2016-229536

(51) Int. Cl.
*H03H 9/64* (2006.01)
*H03H 7/38* (2006.01)
(Continued)

(52) U.S. Cl.
CPC ............ *H03H 9/6483* (2013.01); *H03H 7/38* (2013.01); *H03H 9/145* (2013.01);
(Continued)

(58) Field of Classification Search
CPC .............................................. H03H 9/54–76
See application file for complete search history.

(56) References Cited

U.S. PATENT DOCUMENTS 5,675,296 A 10/1997 Tomikawa
7,034,638 B2 * 4/2006 Yamamoto ........... H03H 9/6483
310/313 R
(Continued)

FOREIGN PATENT DOCUMENTS

JP 08-307199 A 11/1996
JP 2001-203556 A 7/2001
(Continued)

OTHER PUBLICATIONS

Official Communication issued in International Patent Application No. PCT/JP2017/042077, dated Feb. 6, 2018.
(Continued)

*Primary Examiner* — Dean O Takaoka
*Assistant Examiner* — Alan Wong
(74) *Attorney, Agent, or Firm* — Keating & Bennett, LLP

(57) ABSTRACT

An acoustic wave filter includes a series-arm resonator, a first parallel-arm resonator, and a second parallel-arm resonator. The series-arm resonator is disposed on a path connecting first and second input/output terminals. The first parallel-arm resonator is disposed on a path that connects ground with a node, which is located on a path connecting the series-arm resonator with the first input/output terminal. The second parallel-arm resonator is disposed on a path that connects ground with a node, which is located on a path connecting the series-arm resonator with the second input/output terminal. The parallel-arm resonator has a resonant frequency lower than the resonant frequency of the second parallel-arm resonator. The first parallel-arm resonator has an anti-resonant frequency higher than the anti-resonant frequency of the second parallel-arm resonator. The second parallel-arm resonator has the highest resonant frequency of all the parallel-arm resonators.

20 Claims, 7 Drawing Sheets

(51) Int. Cl.
*H03H 9/145* (2006.01)
*H03H 9/25* (2006.01)

(52) U.S. Cl.
CPC .......... *H03H 9/14538* (2013.01); *H03H 9/25* (2013.01); *H03H 9/64* (2013.01)

(56) References Cited

U.S. PATENT DOCUMENTS

| | | | | |
|---|---|---|---|---|
| 7,564,174 B2* | 7/2009 | Matsuda | ............... | H03H 9/0038 |
| | | | | 310/313 R |
| 7,573,354 B2* | 8/2009 | Nishihara | ............... | H03H 9/605 |
| | | | | 333/133 |
| 7,688,161 B2* | 3/2010 | Miura | ............... | H03H 9/6483 |
| | | | | 333/193 |
| 8,183,958 B2* | 5/2012 | Fujita | ............... | H03H 9/6483 |
| | | | | 333/133 |
| 8,242,861 B2* | 8/2012 | Yata | ............... | H03H 9/6483 |
| | | | | 333/193 |
| 9,048,813 B2* | 6/2015 | Iwasaki | ............... | H03H 9/25 |
| 9,300,038 B2* | 3/2016 | Burgener | ............... | H03H 9/0014 |
| 9,595,941 B2* | 3/2017 | Nishihara | ............... | H03H 9/605 |
| 10,090,824 B2* | 10/2018 | Nakahashi | ............... | H03H 9/0009 |
| 10,277,191 B2* | 4/2019 | Takata | ............... | H03H 9/706 |
| 10,819,312 B2* | 10/2020 | Nosaka | ............... | H03F 3/20 |
| 2001/0008387 A1 | 7/2001 | Taniguchi | | |
| 2004/0140866 A1 | 7/2004 | Taniguchi | | |
| 2004/0227587 A1 | 11/2004 | Inoue et al. | | |
| 2008/0061657 A1 | 3/2008 | Matsuda et al. | | |
| 2010/0207707 A1 | 8/2010 | Yata | | |
| 2011/0037344 A1 | 2/2011 | Yamane et al. | | |

FOREIGN PATENT DOCUMENTS

| | | | | |
|---|---|---|---|---|
| JP | 2004-242281 A | | 8/2004 | |
| JP | 2004-343168 A | | 12/2004 | |
| JP | 2005-136588 A | | 5/2005 | |
| JP | 2008-067289 A | | 3/2008 | |
| JP | 2015-041909 A | | 3/2015 | |
| WO | 2009/119007 A1 | | 10/2009 | |
| WO | 20091133655 A1 | | 11/2009 | |
| WO | WO-2015083415 A1 * | | 6/2015 | ............... H03H 9/64 |

OTHER PUBLICATIONS

Michigami, "Acoustic Wave Filter Device", U.S. Appl. No. 17/091,193, filed Nov. 6, 2020.

* cited by examiner

ACOUSTIC WAVE FILTER DEVICE

CROSS REFERENCE TO RELATED APPLICATIONS

This application claims the benefit of priority to Japanese Patent Application No. 2016-229536 filed on Nov. 25, 2016 and is a Continuation Application of PCT Application No. PCT/JP2017/042077 filed on Nov. 22, 2017. The entire contents of each application are hereby incorporated herein by reference.

BACKGROUND OF THE INVENTION

1. Field of the Invention

The present invention relates to an acoustic wave filter device including an acoustic wave resonator.

2. Description of the Related Art

In related art, acoustic wave filters utilizing acoustic waves have been widely used as bandpass filters placed at the front-end section of mobile communication apparatuses. To meet the demand for increasingly complex operations such as multimode/multiband operations, radio frequency front-end circuits or communication apparatuses including a plurality of acoustic wave filters have been put into practical use.

Acoustic wave filters designed for multiband operation will be increasingly required in the future to have a wide band width like, for example, LTE Band 41 (pass band: 2496-2690 MHz), and steep attenuation characteristics (WLAN band: 2400-2472 MHz). Japanese Unexamined Patent Application Publication No. 2004-343168 discloses a filter device with steep attenuation characteristics. More specifically, among a plurality of parallel-arm resonators of a ladder bandpass filter, one parallel-arm resonator is made to have an effective electromechanical coupling coefficient different from the effective electromechanical coupling coefficients of other parallel-arm resonators. According to Japanese Unexamined Patent Application Publication No. 2004-343168, this configuration enables the filter device to have steep attenuation characteristics over a narrow band width.

The configuration of the filter device disclosed in Japanese Unexamined Patent Application Publication No. 2004-343168 enables steep attenuation characteristics to be obtained by making the effective electromechanical coupling coefficient of the one parallel-arm resonator mentioned above comparatively low. However, with the filter device, it is difficult to increase the width of the pass band and the width of the stop band near the pass band. An attempt to achieve a wider pass band and a lower insertion loss for the filter device results in a failure to provide sufficient steepness.

SUMMARY OF THE INVENTION

Accordingly, preferred embodiments of the present invention provide acoustic wave filter devices each achieving a wider pass band and a wider stop band on a lower side of the pass band, with a steep transition region provided between the pass band and the stop band.

According to a preferred embodiment of the present invention, an acoustic wave filter device includes one or more series-arm resonators and two or more parallel-arm resonators. The acoustic wave filter device includes a first input/output terminal and a second input/output terminal to or from which a radio frequency signal is input or output, a first series-arm resonator including an acoustic wave resonator, the first series-arm resonator being disposed on a path that connects the first input/output terminal with the second input/output terminal, a first parallel-arm resonator disposed on a path that connects a first node with ground, the first node being located on a path that connects the first series-arm resonator with the first input/output terminal, and a second parallel-arm resonator disposed on a path that connects a second node with ground, the second node being located on a path that connects the first series-arm resonator with the second input/output terminal. The first parallel-arm resonator has a resonant frequency lower than the resonant frequency of the second parallel-arm resonator. The first parallel-arm resonator has an anti-resonant frequency higher than the anti-resonant frequency of the second parallel-arm resonator. The resonant frequency of the second parallel-arm resonator is the highest of all the parallel-arm resonators of the acoustic wave filter device.

The anti-resonant point of a parallel-arm resonator determines the bandpass characteristics in the pass band of a filter, and the resonant point determines the attenuation characteristics on the lower side of the pass band of the filter.

According to the above-mentioned configuration, the resonant band width of the first parallel-arm resonator, which is defined as the difference between the resonant frequency and the anti-resonant frequency, is greater than the resonant band width of the second parallel-arm resonator. Further, the anti-resonant frequency of the first parallel-arm resonator is higher than the anti-resonant frequency of the second parallel-arm resonator. This configuration makes it possible to increase the width of the pass band, in comparison to making the respective anti-resonant frequencies of parallel-arm resonators substantially equal. Further, the resonant band width of the first parallel-arm resonator is greater than the resonant band width of the second parallel-arm resonator, and the resonant frequency of the first parallel-arm resonator is lower than the resonant frequency of the second parallel-arm resonator. This configuration makes it possible to increase the width of the stop band on the lower side of the pass band, in comparison to making the respective resonant frequencies of parallel-arm resonators substantially equal. Furthermore, the second parallel-arm resonator has the highest resonant frequency of all the parallel-arm resonators. The steepness of the transition region between the pass band and the low-side stop band is thus determined by the resonant point-antiresonant point characteristics of the second parallel-arm resonator. Since the resonant point-antiresonant point characteristics of the second parallel-arm resonator are steeper than the resonant point-antiresonant point characteristics of the first parallel-arm resonator, the steepness of the above-mentioned transition region improves.

In an alternative configuration, the second parallel-arm resonator may have an effective electromechanical coupling coefficient that is the lowest of all the parallel-arm resonators of the acoustic wave filter device.

According to the above-mentioned configuration, of all the parallel-arm resonators, the second parallel-arm resonator with the smallest resonant band width has the highest resonant frequency. This makes it possible to increase the steepness of the above-mentioned transition region.

In an alternative configuration, the first parallel-arm resonator may have an effective electromechanical coupling coefficient that is the highest of all the parallel-arm resonators of the acoustic wave filter device.

According to the above-mentioned configuration, the first parallel-arm resonator has the greatest resonant band width of all the parallel-arm resonators. This makes it possible to achieve a wider pass band, and also a wider stop band on the lower side of the pass band.

According to a preferred embodiment of the present invention, in an acoustic wave filter device, the one or more series-arm resonators and the two or more parallel-arm resonators may each be a surface acoustic wave resonator.

As a result of the above-mentioned configuration, a ladder surface acoustic wave filter is provided. This helps achieve filter bandpass characteristics with lower loss, and also miniaturization.

In an alternative configuration, the first parallel-arm resonator and the second parallel-arm resonator may each include at least a piezoelectric body and an IDT electrode. The second parallel-arm resonator may further include a second dielectric layer provided between the piezoelectric and the IDT electrode to adjust an effective electromechanical coupling coefficient. A dielectric layer that adjusts an effective electromechanical coupling coefficient may not be provided between the piezoelectric body and the IDT electrode of the first parallel-arm resonator, or a first dielectric layer, which is provided between the piezoelectric body and the IDT electrode of the first parallel-arm resonator to adjust an effective electromechanical coupling coefficient, may be thinner than the second dielectric layer.

According to the above-mentioned configuration, a dielectric layer is provided between the piezoelectric body and the IDT electrode, or a dielectric layer is disposed to cover the IDT electrode. The effective electromechanical coupling coefficient of the second parallel-arm resonator is thus lower than the effective electromechanical coupling coefficient of the first parallel-arm resonator. Consequently, the resonant band width of the first parallel-arm resonator is greater than the resonant band width of the second parallel-arm resonator. This makes it possible to achieve a wider pass band, a wider stop band on the lower side of the pass band, and improved steepness of the above-mentioned transition region.

If the effective electromechanical coupling coefficient is adjusted by the provision of the above-mentioned dielectric layer, this results in a lower temperature coefficient of frequency (TCF) than if no such dielectric layer is provided. That is, the second parallel-arm resonator has a lower temperature coefficient of frequency (TCF) than the first parallel-arm resonator. In this regard, since each resonator experiences a rise in temperature upon application of a radio frequency signal, it is particularly important to reduce or minimize deterioration of filter characteristics at higher temperatures. At higher temperatures, the lower end of the pass band shifts in a direction that increases the pass band width, whereas the above-mentioned transition region on the lower side of the pass band shifts in a direction that narrows the stop band. The steepness of the transition region is determined by the second parallel-arm resonator. Consequently, under high temperature condition, the amount of temperature-induced shift (toward lower frequencies) in the transition region is less than the amount of temperature-induced shift (toward lower frequencies) at the lower end of the pass band. Thus, the steepness of the above-mentioned transition region under high temperature condition does not deteriorate relative to the steepness under room temperature condition. Therefore, deterioration of attenuation characteristics in the above-mentioned transition region is able to be reduced or minimized without deteriorating the bandpass characteristics under high temperature condition in comparison to the bandpass characteristics under room temperature condition.

In an alternative configuration, the acoustic wave filter device may further include a capacitor connected in parallel with the second parallel-arm resonator.

As a result of the above-mentioned configuration, the effective electromechanical coupling coefficient of the second parallel-arm resonator is lower than the effective electromechanical coupling coefficient of the first parallel-arm resonator. Consequently, the resonant band width of the second parallel-arm resonator is smaller than the resonant band width of the first parallel-arm resonator. This makes it possible to achieve a wider pass band, a wider stop band on the lower side of the pass band, and improved steepness of the above-mentioned transition region.

In an alternative configuration, the capacitor may include a comb electrode disposed on a piezoelectric body, and a dielectric layer that adjusts an effective electromechanical coupling coefficient may not be provided between the piezoelectric and the comb electrode.

This configuration helps provide a large capacitance per unit area of the capacitor due to the absence of a dielectric layer between the capacitor and the piezoelectric body. The capacitor is thus able to be reduced in size, leading to miniaturization of the acoustic wave filter device.

In an alternative configuration, the acoustic wave filter device may further include an inductor connected in parallel with the first parallel-arm resonator.

As a result of the above-mentioned configuration, the effective electromechanical coupling coefficient of the first parallel-arm resonator is higher than the effective electromechanical coupling coefficient of the second parallel-arm resonator. Consequently, the resonant band width of the first parallel-arm resonator is greater than the resonant band width of the second parallel-arm resonator. This makes it possible to achieve a wider pass band, a wider stop band on the lower side of the pass band, and improved steepness of the above-mentioned transition region.

In an alternative configuration, the second parallel-arm resonator may include a piezoelectric body and an IDT electrode, and a comb electrode of the IDT electrode may be a thinned electrode.

As a result of the above-mentioned configuration, the effective electromechanical coupling coefficient of the second parallel-arm resonator is lower than the effective electromechanical coupling coefficient of the first parallel-arm resonator. Consequently, the resonant band width of the second parallel-arm resonator is smaller than the resonant band width of the first parallel-arm resonator. This makes it possible to achieve a wider pass band, a wider stop band on the lower side of the pass band, and improved steepness of the transition region.

Preferred embodiments of the present invention make it possible to provide acoustic wave filter devices each achieving a wider pass band and a wider stop band on the lower side of the pass band, with a steep transition region provided between the pass band and the stop band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
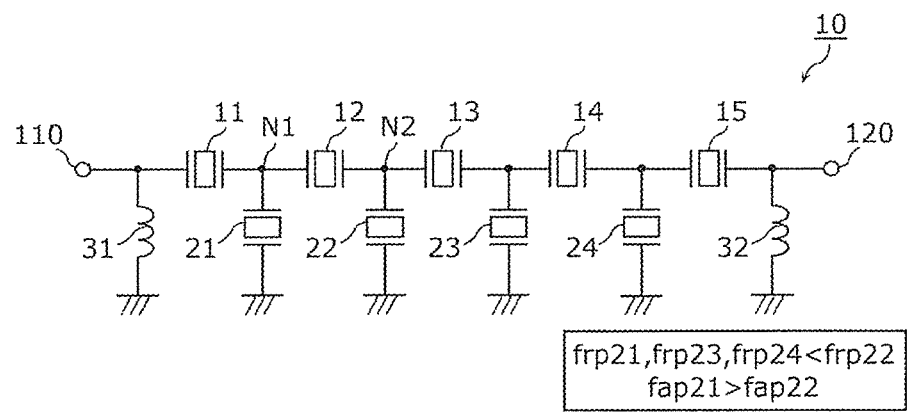
FIG. 1 illustrates the circuit configuration of an acoustic wave filter according to a preferred embodiment of the present invention.

The present invention will be described in detail below with reference to preferred embodiments and drawings. Preferred embodiments described below each represent generic or specific examples. Features presented in the following preferred embodiments, such as numerical values, shapes, materials, components, and the placement and connection of components, are illustrative only and not intended to be limiting of the present invention. Of the components illustrated in the following preferred embodiments, those components not described in the independent claim representing the broadest concept of the present invention will be described as optional components. The sizes of components illustrated in the drawings or the ratios between the sizes of these components may not necessary be drawn to scale. Throughout the drawings, identical reference signs are used to designate substantially identical elements, and repetitive description will be sometimes omitted or simplified.

FIG. 1 illustrates the circuit configuration of an acoustic wave filter according to a preferred embodiment of the present invention. An acoustic wave filter 10 is, for example, an acoustic wave filter device disposed at the front-end section of a multimode/multiband-capable cellular phone. The acoustic wave filter 10 is disposed at, for example, the front-end section of a cellular phone or other devices that support Long Term Evolution (LTE) standard to perform filtering of radio frequency signals in bands (frequency bands) specified by the Third Generation Partnership Project (3GPP). The acoustic wave filter 10 is an acoustic wave filter device that uses an acoustic wave resonator to perform filtering of radio frequency signals.

As illustrated in FIG. 1, the acoustic wave filter 10 includes series-arm resonators 11, 12, 13, 14 and 15, parallel-arm resonators 21, 22, 23 and 24, inductors 31 and 32, and input/output terminals 110 and 120.

Each of the series-arm resonators 11 to 15 is an acoustic wave resonator disposed on a path that connects the input/output terminals 110 and 120. Among these, the series-arm resonator 12 represents a first series-arm resonator disposed on the above-mentioned path.

Each of the parallel-arm resonators 21 to 24 is an acoustic wave resonator disposed between ground and the corresponding one of the nodes that connect the input/output terminal 110, the series-arm resonators 11 to 15, and the input/output terminal 120. Among these, the parallel-arm resonator 21 represents a first parallel-arm resonator disposed on a path that connects ground with a node N1 (first node), which is a node located on a path connecting the input/output terminal 110 with the series-arm resonator 12. The parallel-arm resonator 22 represents a second parallel-arm resonator disposed on a path that connects ground with a node N2 (second node), which is a node located on a path connecting the input/output terminal 120 with the series-arm resonator 12.

The inductors 31 and 32 are respectively a matching element used to perform impedance matching with an external circuit connected to the input/output terminal 110, and a matching element used to perform impedance matching with an external circuit connected to the input/output terminal 120. The inductors 31 and 32 may not be provided.

In the acoustic wave filter according to the present preferred embodiment, the first parallel-arm resonator has a resonant frequency lower than the resonant frequency of the second parallel-arm resonator. The first parallel-arm resonator has an anti-resonant frequency higher than the anti-resonant frequency of the second parallel-arm resonator. Further, of all the parallel-arm resonators of the acoustic wave filter, the second parallel-arm resonator has the highest resonant frequency.

More specifically, in the acoustic wave filter 10 illustrated in FIG. 1, the parallel-arm resonators 21, 23, and 24 respectively have resonant frequencies frp21, frp23, and frp24 that are lower than a resonant frequency frp22 of the parallel-arm resonator 22. The parallel-arm resonator 21 has an anti-resonant frequency fap21 higher than an anti-resonant frequency fap22 of the parallel-arm resonator 22.

Acoustic wave filters according to preferred embodiments of the present invention are not limited to the circuit configuration of the acoustic wave filter 10 mentioned above. For example, the number of parallel-arm resonators may not be four but may be any number greater than or equal to two. The first parallel-arm resonator (the parallel-arm resonator 21 in FIG. 1) with the above-mentioned resonant characteristics may not necessarily be connected to a node located between the series-arm resonators 11 and 12, but may be connected to another node located on the path connecting the input/output terminals 110 and 120. The second parallel-arm resonator (the parallel-arm resonator 22 in FIG. 1) may not necessarily be connected to a node located between the series-arm resonators 12 and 13, but may be connected to another node that is located on the above-mentioned path and not connected with the first parallel-arm resonator. Further, the first parallel-arm resonator and the second parallel-arm resonator may not be disposed with only a single series-arm resonator interposed therebetween. The first parallel-arm resonator and the second parallel-arm resonator may be disposed with two or more series-arm resonators interposed therebetween. That is, the first parallel-arm resonator and the second parallel-arm resonator, and other parallel-arm resonators may be arranged in any positional relationship.

In acoustic wave filter according to preferred embodiments of the present invention, each series-arm resonator and each parallel-arm resonator may include two or more acoustic wave resonators divided in series. In this case, with such two or more series divided acoustic wave resonators being regarded as a single series-arm resonator or a single parallel-arm resonator, each resonator preferably is designed to satisfy Equations 1 to 4 described later.

Acoustic wave filters according to preferred embodiments of the present invention may include a longitudinally coupled resonator, other than the series-arm and parallel-arm resonators arranged in a ladder configuration.

Operation and effects of the acoustic wave filter 10 with the parallel-arm resonators having the resonant characteristics mentioned above will be described in detail below.

First, the basic operating principle of a ladder filter including series-arm resonators and parallel-arm resonators as illustrated in FIG. 1 will be described.

Figure 2:
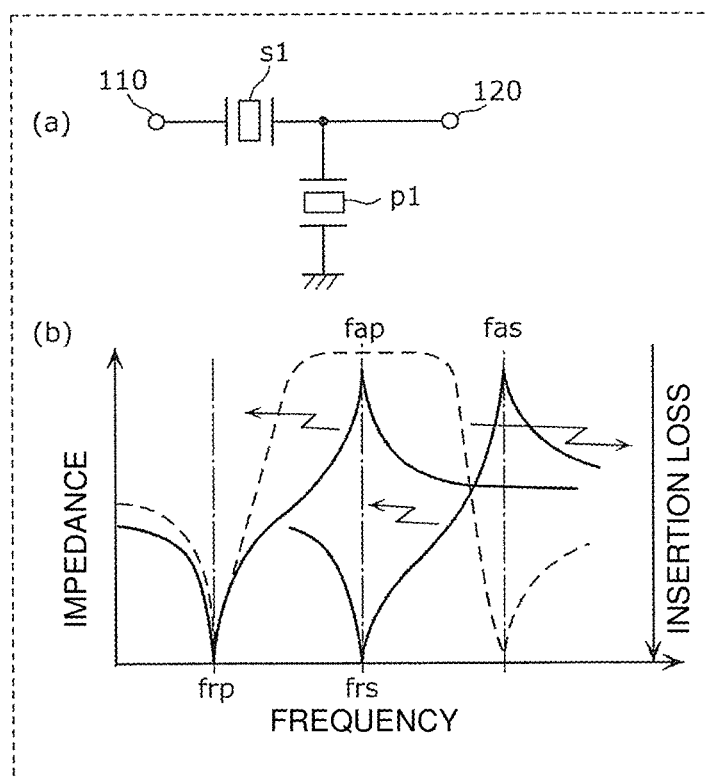
FIG. 2 illustrates the operating principle of a typical ladder filter circuit.

FIG. 2 illustrates the operating principle of a typical ladder acoustic wave filter. The acoustic wave filter illustrated in (a) of FIG. 2 represents a basic ladder filter including a single series-arm resonator s1 and a single parallel-arm resonator p1. As illustrated in (b) of FIG. 2, the parallel-arm resonator p1 has resonant characteristics with a resonant frequency frp and an anti-resonant frequency fap (>frp). The series-arm resonator s1 has resonant characteristics with a resonant frequency frs and an anti-resonant frequency fas (>frs>frp).

In constructing a bandpass filter by using a ladder arrangement of resonators, the anti-resonant frequency fap of the parallel-arm resonator p1, and the resonant frequency frs of the series-arm resonator s1 are placed in close proximity to each other. Consequently, the region near the resonant frequency frp where the impedance of the parallel-arm resonator p1 approaches zero becomes a low-side rejection band. At frequencies above this resonant frequency, the parallel-arm resonator p1 exhibits high impedance at frequencies near the anti-resonant frequency fap, and the impedance of the series-arm resonator s1 approaches zero at frequencies near the resonant frequency frs. Consequently, the region near the frequency range between the anti-resonant frequency fap and the resonant frequency frs becomes the pass band for signals on the signal path from the input/output terminal 110 to the input/output terminal 120. At even higher frequencies, the series-arm resonator s1 exhibits high impedance in a frequency region near the anti-resonant frequency fas. This region becomes a high-side rejection band.

The number of resonant stages including parallel-arm and series-arm resonators is improved or optimized as appropriate in accordance with required specifications. Generally, in constructing an acoustic wave filter including a plurality of resonant stages, the respective anti-resonant frequencies fap of a plurality of parallel-arm resonators are made equal or substantially equal, and the respective anti-resonant frequencies fas of a plurality of series-arm resonators are made equal or substantially equal.

Figure 3:
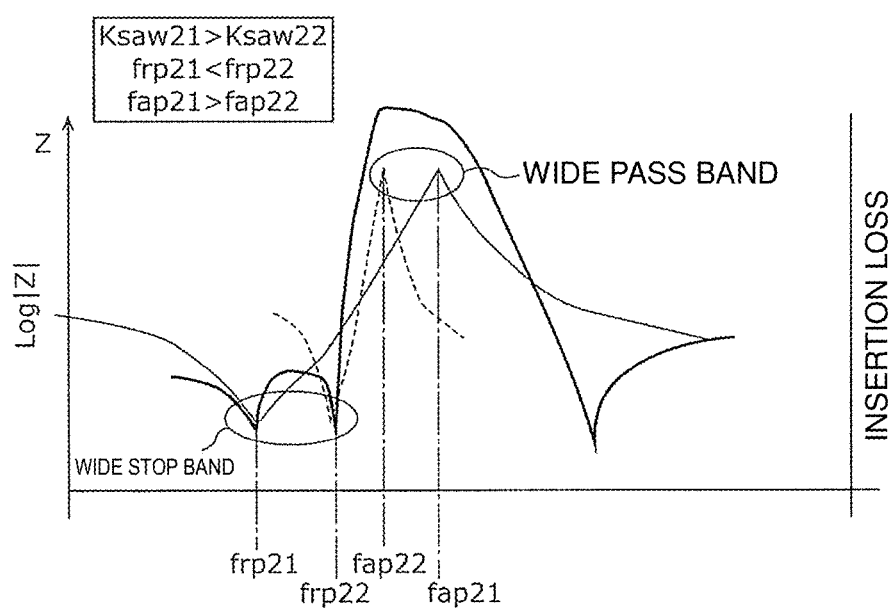
FIG. 3 schematically illustrates the bandpass characteristics and resonant characteristics of the acoustic wave filter according to a preferred embodiment of the present invention.

FIG. 3 schematically illustrates the bandpass characteristics and resonant characteristics of the acoustic wave filter 10 according to the present preferred embodiment. More specifically, FIG. 3 illustrates schematic waveforms representing the respective resonant characteristics of the parallel-arm resonator 21 (first parallel-arm resonator) and the parallel-arm resonator 22 (second parallel-arm resonator), which are parallel-arm resonators of the acoustic wave filter 10 according to the present preferred embodiment, and the bandpass characteristics of the acoustic wave filter 10.

As illustrated in FIG. 3, the respective resonant characteristics of the parallel-arm resonators 21 and 22 satisfy the relationships given in Equations 1 and 2 below.

$$frp21 < frp22 \quad \text{(Eq. 1)}$$

$$fap21 > fap22 \quad \text{(Eq. 2)}$$

Due to Equations 1 and 2, the resonant band width of the parallel-arm resonator 21, which is defined as the difference between its resonant frequency and its anti-resonant frequency, is greater than the resonant band width of the parallel-arm resonator 22. That is, an effective electromechanical coupling coefficient Ksaw21 of the parallel-arm resonator 21, and an effective electromechanical coupling coefficient Ksaw22 of the parallel-arm resonator 22 satisfy the relationship in Equation 3.

$$Ksaw21 > Ksaw22 \quad \text{(Eq. 3)}$$

A case is considered in which, as illustrated in (b) of FIG. 2, the respective resonant frequencies of a plurality of parallel-arm resonators of an acoustic wave filter are made equal or substantially equal in accordance with the basic operating principle of a ladder filter. In this case, a large attenuation is able to be provided at the attenuation pole located near the lower side of the pass band. However, a large rebound occurs at frequencies below this attenuation pole, making it impossible to obtain a sufficient stop band width and a sufficient attenuation.

By contrast, with the acoustic wave filter according to the present preferred embodiment, the resonant frequency frp21 of the parallel-arm resonator 21 is set lower than the resonant frequency frp22 of the parallel-arm resonator 22 as in Equation 1. Consequently, in addition to the attenuation pole defined by the resonant frequency frp22 of the parallel-arm resonator 22 and located near the lower side of the pass band, an attenuation pole defined by the resonant frequency frp21 of the parallel-arm resonator 21 is created on the lower frequency side of the above-mentioned attenuation pole. This configuration makes it possible to increase the width of the stop band on the lower side of the pass band, in comparison to making the respective resonant frequencies of parallel-arm resonators substantially equal.

As in Equation 2, the anti-resonant frequency fap21 of the parallel-arm resonator 21 is set higher than the anti-resonant frequency fap22 of the parallel-arm resonator 22. This configuration makes it possible to increase the width of the pass band determined by the anti-resonant frequency f a parallel-arm resonator and the resonant frequency of a series-arm resonator, in comparison to making the respective anti-resonant frequencies of parallel-arm resonators substantially equal.

Further, as in Equation 4 below, the resonant frequency frp22 of the parallel-arm resonator 22 is set higher than the resonant frequencies of other parallel-arm resonators.

$$frp22 > frp21, frp23, frp24 \quad \text{(Eq. 4)}$$

Due to the relationships in Equations 4 and 2 mentioned above, for the acoustic wave filter 10 according to the present preferred embodiment, the steepness of the transition region between the pass band and the low-side stop band is determined by the parallel-arm resonator 22. For a typical ladder configuration as illustrated in (a) of FIG. 2, the steepness of the above-mentioned transition region increases with decreasing resonant band width of a parallel-arm resonator. Now, due to Equation 3, the resonant band width of the parallel-arm resonator 22 is narrower than the resonant band width of the parallel-arm resonator 21. This improves the steepness of the stop band mentioned above.

Preferably, the effective electromechanical coupling coefficient Ksaw22 of the parallel-arm resonator 22 is the lowest of all the parallel-arm resonators 21 to 24 of the acoustic wave filter 10. As a result, of all the parallel-arm resonators 21 to 24, the parallel-arm resonator 22 with the narrowest resonant band width has the highest resonant frequency frp22. This makes it possible to increase the steepness of the above-mentioned transition region.

Preferably, the effective electromechanical coupling coefficient Ksaw21 of the parallel-arm resonator 21 is the highest of all the parallel-arm resonators 21 to 24 of the acoustic wave filter 10. Consequently, the parallel-arm resonator 21 has the greatest resonant band width of all the parallel-arm resonators 21 to 24. This makes it possible to achieve a wider pass band, and also a wider low-side stop band.

Next, the structure of the acoustic wave resonators of the acoustic wave filter will be described. The following description will particularly focus on a specific structure with which the resonant band width is varied by varying the effective electromechanical coupling coefficient among a plurality of parallel-arm resonators.

The series-arm resonators 11 to 15 and the parallel-arm resonators 21 to 24, which constitute the acoustic wave filter 10 according to the present preferred embodiment, are surface acoustic wave resonators. The resulting filter is thus a ladder surface acoustic wave filter. This helps achieve filter bandpass characteristics with lower loss, and also miniaturization.

Figure 4:
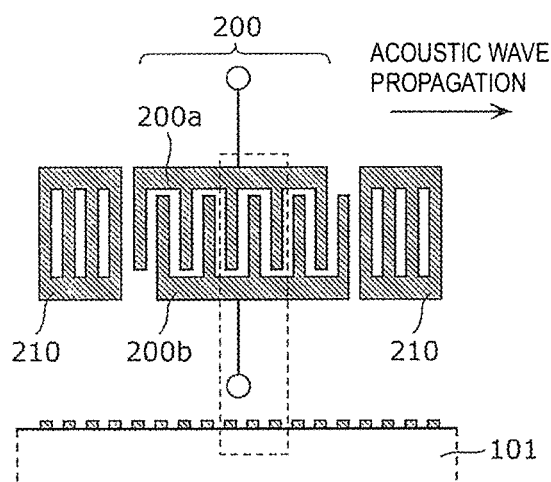
FIG. 4 illustrates, in plan and in cross-section, the configuration of electrodes of the acoustic wave filter according to a preferred embodiment of the present invention.
Figure 5:
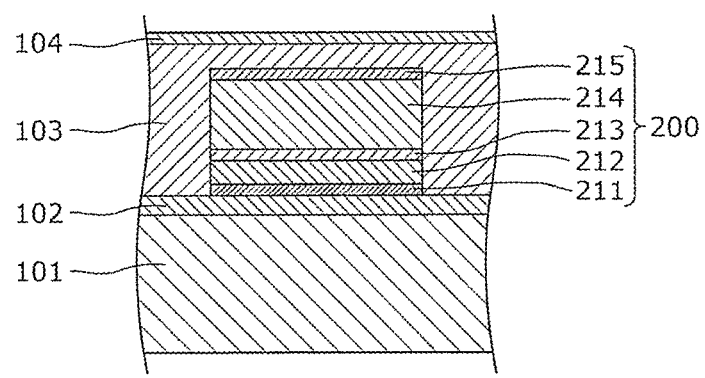
FIG. 5 illustrates a cross-section of the structure of an IDT electrode and its vicinity according to a preferred embodiment of the present invention.

FIG. 4 illustrates, in plan and in cross-section, the configuration of electrodes of the acoustic wave filter according to the present preferred embodiment. FIG. 5 illustrates a cross-section of the structure of an interdigital transducer (IDT) electrode and its vicinity according to the present preferred embodiment. FIGS. 4 and 5 schematically illustrate, in plan and in cross-section, the structure of the parallel-arm resonator 22 among the resonators of the acoustic wave filter 10. The parallel-arm resonator 22 in FIG. 4 is illustrated for the purpose of explaining a typical structure of a plurality of acoustic wave resonators of the acoustic wave filter 10. Accordingly, features such as the number and length of electrode fingers of each electrode are not limited to those depicted in FIG. 4.

As illustrated in FIG. 5, the parallel-arm resonator 22 includes a substrate 101, a dielectric layer 102, an IDT electrode 200, and protective layers 103 and 104.

The substrate 101 is made of, for example, −11° Y-cut X-propagation LiNbO$_3$ piezoelectric single crystal. The substrate 101 may be any substrate as long as at least a portion of the substrate 101 has piezoelectric property. For example, the substrate 101 may have a piezoelectric thin film disposed over its surface, and may include a multilayer body including components such as a film with an acoustic velocity different from the acoustic velocity of the piezoelectric thin film, and a support substrate. Alternatively, the entirety of the substrate 101 may have piezoelectric property. In this case, the substrate 101 is a piezoelectric substrate including a single piezoelectric layer.

As illustrated in FIG. 4, the IDT electrode 200 includes a pair of comb electrodes 200a and 200b facing each other. Each of the comb electrodes 200a and 200b includes a plurality of electrode fingers that are parallel or substantially parallel to each other, and a busbar electrode that connects the plurality of electrode fingers. The electrode fingers extend in a direction perpendicular or substantially perpendicular to the direction of propagation. A reflector 210 is disposed at each side of the IDT electrode 200. The reflector 210 may be a weight or mass, or may not be provided.

As illustrated in FIG. 5, the IDT electrode 200 is preferably formed by stacking, for example, the following metal films in the order stated below as viewed from the substrate 101: a metal film 211 made of NiCr; a metal film 212 made of Pt; a metal film 213 made of Ti; a metal film 214 made of Al; and a metal film 215 made of Ti.

The protective layers 103 and 104 each represent a fourth dielectric layer, which is provided for purposes such as protecting the IDT electrode 200 from the external environment, adjusting the temperature coefficient of frequency, and enhancing moisture resistance. The protective layer 103 is made of, for example, SiO$_2$, and the protective layer 104 is made of, for example, SiN.

The dielectric layer 102 represents a second dielectric layer provided between the substrate 101 and the IDT electrode 200 to adjust the electromechanical coupling coefficient and the temperature coefficient of frequency. The dielectric layer 102 is made of, for example, SiO$_2$.

The metal film 212 made of Pt is the metal film with the highest density of all the metal films 211 to 215 of the multilayer body. The metal films 211, 213, 214 and 215 represent metal films other than the metal film 212 having the highest density.

The configuration of the IDT electrode 200 illustrated in FIG. 5 is illustrative only and not intended to be limiting. Instead of being formed as a multilayer metal-film structure, the IDT electrode 200 may be formed as a single metal-film layer. The materials forming the metal films and the protective layers are not limited to those mentioned above. The IDT 200 may be made of a metal such as Ti, Al, Cu, Pt, Au, Ag, or Pd, or an alloy thereof, or may be formed by a plurality of multilayer bodies made of the above-mentioned metal or alloy. The substrate 101 may be made of, for example, LiTaO$_3$ piezoelectric single crystal, KNbO$_3$ piezoelectric single crystal, quartz crystal, or piezoelectric ceramics. The protective layers 103 and 104, and the dielectric layer 102 may not necessarily be configured as described above but may be each formed by, for example, a dielectric or insulator of SiO$_2$, SiN, AlN, polyimide, or other materials, or of a multilayer body of such materials. The protective layers 103 and 104 may not be provided.

With the above-mentioned configuration, the effective electromechanical coupling coefficient Ksaw increases with decreasing thickness of the dielectric layer 102, and the effective electromechanical coupling coefficient Ksaw decreases with increasing thickness of the dielectric layer 102. The effective electromechanical coupling coefficient Ksaw is greatest when the dielectric layer 102 is not provided between the substrate 101 and the IDT electrode.

With the above-mentioned configuration, the effective electromechanical coupling coefficient Ksaw increases as the protective layers 103 and 104 decrease in thickness, and the effective electromechanical coupling coefficient Ksaw decreases as the protective layers 103 and 104 increase in thickness. The effective electromechanical coupling coefficient Ksaw is greatest when the protective layers 103 and 104 are not provided over the IDT electrode.

According to the present preferred embodiment, the parallel-arm resonator 22 (second parallel-arm resonator) includes the second dielectric layer (dielectric layer 102) mentioned above. By contrast, no dielectric layer for adjusting the effective electromechanical coupling coefficient is provided between the substrate 101 and the IDT electrode of the parallel-arm resonator (first parallel-arm resonator), or a first dielectric layer, which is provided between the substrate 101 and the IDT electrode of the parallel-arm resonator 21 (first parallel-arm resonator) to adjust the effective electromechanical coupling coefficient, is thinner than the second dielectric layer. Consequently, Equation 3 is satisfied.

According to the present preferred embodiment, the effective electromechanical coupling coefficient Ksaw is adjusted by adjusting the film thickness of the dielectric layer 102 provided between the substrate 101 and the IDT electrode. The effective electromechanical coupling coefficient Ksaw may not necessarily be adjusted by this method.

The effective electromechanical coupling coefficient Ksaw may be adjusted by adjusting the film thickness of the protective layers 103 and 104.

That is, the parallel-arm resonator 22 (second parallel-arm resonator) includes a fourth dielectric layer (each of the protective layers 103 and 104). By contrast, no dielectric layer to adjust the effective electromechanical coupling coefficient is provided over the IDT electrode of the parallel-arm resonator 21 (first parallel-arm resonator), or a third dielectric layer, which is provided over the IDT electrode of the parallel-arm resonator 21 (first parallel-arm resonator) to adjust the effective electromechanical coupling coefficient, is thinner than the fourth dielectric layer. Consequently, Equation 3 is satisfied. In this regard, the film thickness of the dielectric layer including the protective layers 103 and 104 is defined as the distance from the surface of the substrate 101 to the surface of the protective layer 104.

The effective electromechanical coupling coefficient Ksaw may be adjusted by a method including both adjusting the film thickness of the dielectric layer 102 and adjusting the film thickness of the protective layers 103 and 104.

Figure 6:
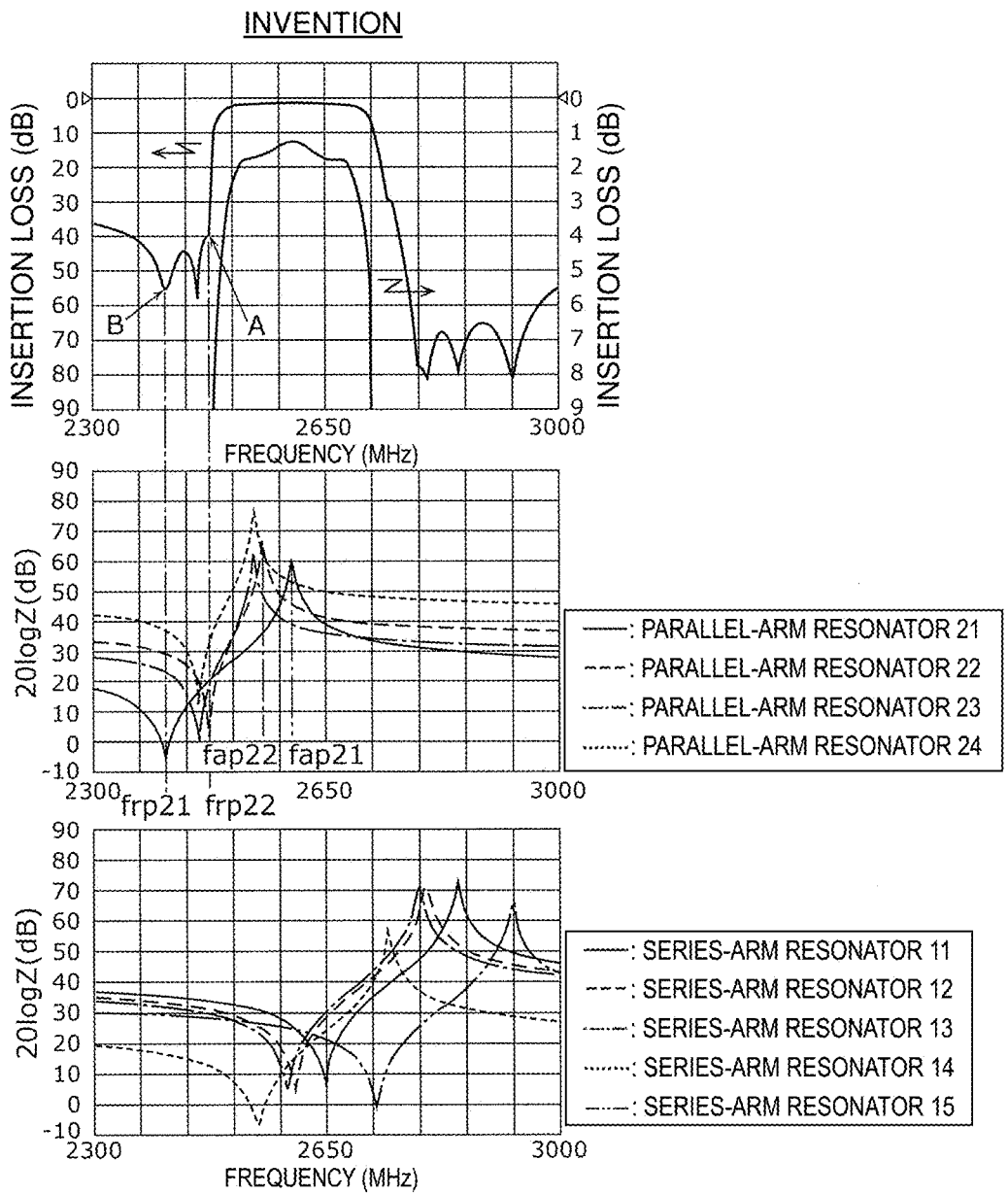
FIG. 6 illustrates graphs representing the bandpass characteristics and resonant characteristics of the acoustic wave filter according to a preferred embodiment of the present invention.

FIG. 6 illustrates graphs representing the bandpass characteristics and resonant characteristics of the acoustic wave filter 10 according to the present preferred embodiment. In FIG. 6, the top graph illustrates the bandpass characteristics (and attenuation characteristics) of the acoustic wave filter 10 according to the present preferred embodiment, the middle graph illustrates the respective resonant characteristics of the parallel-arm resonators 21 to 24, and the bottom graph illustrates the respective resonant characteristics of the series-arm resonators 11 to 15.

The acoustic wave filter 10 according to the present preferred embodiment is preferably used as a bandpass filter for LTE Band 41. More specifically, the acoustic wave filter 10 preferably has a pass band from about 2496 MHz to about 2690 MHz, and a stop band from about 2400 MHz to about 2472 MHz, which corresponds to the WLAN band. This gives a fractional band width of approximately 7.8%, for example. Accordingly, a surface acoustic wave filter with a high electromechanical coupling coefficient in comparison to other bandpass filters is preferred. Accordingly, the acoustic wave filter 10 was designed that utilizes Love waves in −11° Y-cut X-propagation LiNbO$_3$ that allows for high electromechanical coupling coefficient.

Table 1 illustrates the respective resonant parameters of acoustic wave resonators of the acoustic wave filter 10. Table 1 illustrates the resonant frequency fr and anti-resonant frequency fa of each acoustic wave resonator, and (the square of) the effective electromechanical coupling coefficient Ksaw derived from the resonant frequency fr and the anti-resonant frequency fa. The effective electromechanical coupling coefficient Ksaw is given by Equation 5 below based on the resonant frequency fr and the anti-resonant frequency fa.

TABLE 1

|  | Resonant frequency fr (MHz) | Anti-resonant frequency fa (MHz) | Ksaw$^2$ |
|---|---|---|---|
| Parallel-arm resonator 21 | 2405.9 | 2596.63 | 16.87 |
| Parallel-arm resonator 22 | 2479.4 | 2563.38 | 7.83 |
| Parallel-arm resonator 23 | 2454.9 | 2539.75 | 7.98 |
| Parallel-arm resonator 24 | 2454.9 | 2538.88 | 7.90 |
| Series-arm resonator 11 | 2645.63 | 2846.88 | 16.28 |
| Series-arm resonator 12 | 2600.13 | 2799.63 | 16.40 |
| Series-arm resonator 13 | 2587.88 | 2787.38 | 16.47 |
| Series-arm resonator 14 | 2543.25 | 2741.88 | 16.65 |
| Series-arm resonator 15 | 2723.5 | 2927.38 | 16.05 |

Formula 1

$$K^2 = \frac{\pi}{2} \cdot \frac{f_r}{f_a} \cdot \tan\left(\frac{\pi}{2} \cdot \frac{\Delta f}{f_a}\right) \quad \text{(Eq. 5)}$$

In Equation 5, Δf denotes resonant band width (fa−fr).

As illustrated in Table 1 and the middle graph in FIG. 6, the parallel-arm resonators 21 to 24 satisfy Equations 1 to 4 mentioned above. To satisfy the relationships in Equations 1 to 4 mentioned above, the parallel-arm resonator 21 has no dielectric layer between the substrate 101 and the IDT electrode. By contrast, the parallel-arm resonators 22 to 24 each have the second dielectric layer between the substrate 101 and the IDT electrode.

As illustrated in Table 1 and the bottom graph in FIG. 6, the series-arm resonators 11 to 15 do not satisfy all of the relationships in Equations 1 to 4 at the same time, and have substantially the same effective electromechanical coupling coefficient Ksaw. The series-arm resonators ranked in descending order of their resonant frequency fr and anti-resonant frequency fa are the series-arm resonators 15, 11, 12, 13, and 14.

With the acoustic wave filter 10 according to the present preferred embodiment, as in Equation 1 and the middle graph in FIG. 6, the resonant frequency frp21 of the parallel-arm resonator 21 is set lower than the resonant frequency frp22 of the parallel-arm resonator 22. Consequently, in addition to Attenuation Point A defined by the resonant frequency frp22 of the parallel-arm resonator 22 and located near the lower side of the pass band, Attenuation Pole B defined by the resonant frequency frp21 of the parallel-arm resonator 21 is created on the lower frequency side of Attenuation Point A. This configuration makes it possible to increase the width of the stop band on the lower side of the pass band, in comparison to making the respective resonant frequencies of parallel-arm resonators equal or substantially equal.

As in Equation 2 and the middle graph in FIG. 6, the anti-resonant frequency fap1 of the parallel-arm resonator 21 is set higher than the anti-resonant frequency fap2 of the parallel-arm resonator 22. This configuration makes it possible to increase the width of the pass band determined by the anti-resonant frequency of a parallel-arm resonator and the resonant frequency of a series-arm resonator, in comparison to making the respective anti-resonant frequencies of parallel-arm resonators substantially equal.

Further, as in Equation 4 and the middle graph in FIG. 6, the resonant frequency frp22 of the parallel-arm resonator 22 is set higher than the resonant frequencies of other parallel-arm resonators. This configuration improves the steepness of the transition region between the pass band and the low-side stop band.

Figure 7:
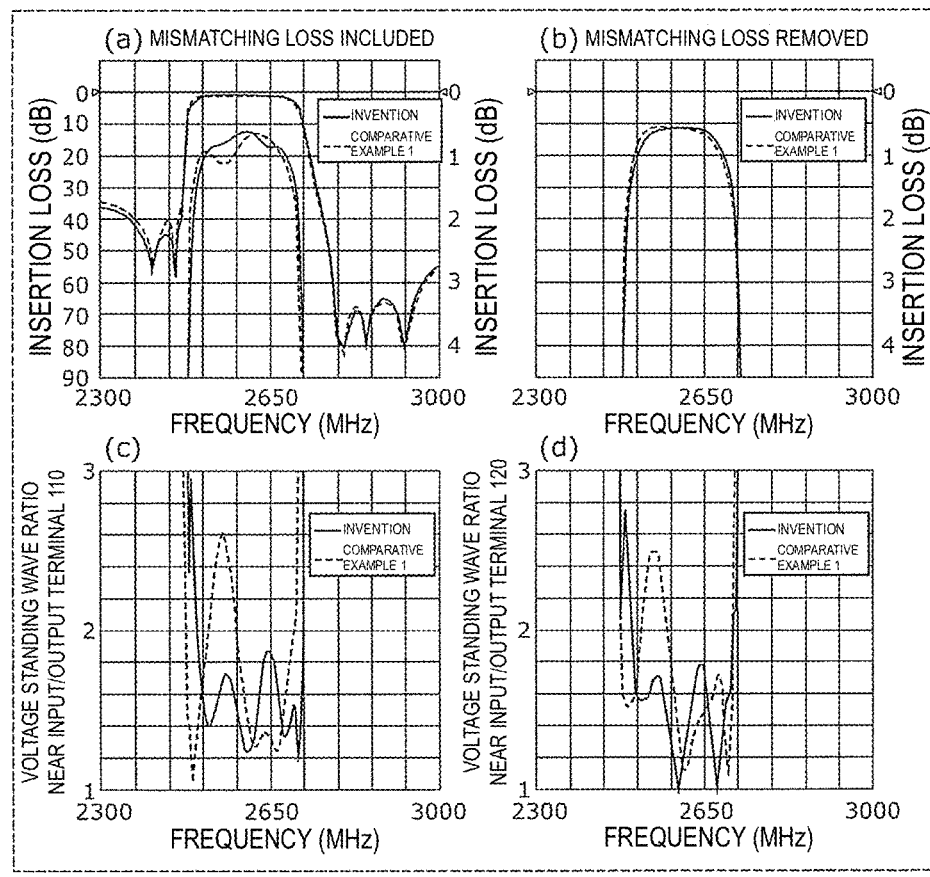
FIG. 7 illustrates graphs comparing the bandpass characteristics and voltage standing wave ratio of the acoustic wave filter according to a preferred embodiment of the present invention with those of an acoustic wave filter according to Comparative Example 1.

FIG. 7 illustrates graphs comparing the bandpass characteristics and voltage standing wave ratio of the acoustic wave filter according to the present preferred embodiment with those of an acoustic wave filter according to Comparative Example 1. With the acoustic wave filter according to Comparative Example 1, among Equations 1 to 4 mentioned above, Equation 2 is not satisfied, and fap21=fap22.

As illustrated in (a) of FIG. 7, the acoustic wave filter according to Comparative Example 1 exhibits deteriorated ripple in the pass band in comparison to the acoustic wave filter 10 according to the present preferred embodiment. Further, as illustrated in (b) of FIG. 7, as for the in-band bandpass characteristics with mismatching loss removed, the acoustic wave filter according to the present preferred embodiment and the acoustic wave filter according to Comparative Example 1 appear to have equal or substantially equal insertion loss. However, as illustrated in (c) and (d) of FIG. 7, the acoustic wave filter according to Comparative Example 1 exhibits deteriorated voltage standing wave ratio (VSWR) in the pass band located on the lower frequency side, in comparison to the acoustic wave filter 10 according to the present preferred embodiment. Since VSWR and band width are in a trade-off relationship, if VSWR in Comparative Example 1 is optimized while maintaining the steepness of the above-mentioned transition region and stop band width, it is not possible to provide a band width substantially equal to the band width of the acoustic wave filter 10 according to the present preferred embodiment.

Figure 8:
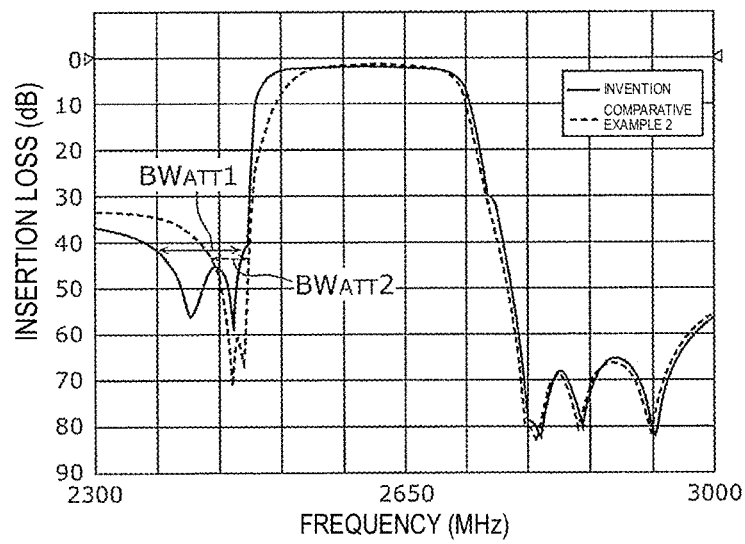
FIG. 8 is a graph comparing bandpass characteristics between the acoustic wave filter according to a preferred embodiment of the present invention and an acoustic wave filter according to Comparative Example 2.

FIG. 8 is a graph comparing bandpass characteristics between the acoustic wave filter according to the present preferred embodiment and an acoustic wave filter according to Comparative Example 2. With the acoustic wave filter according to Comparative Example 2, among Equations 1 to 4 mentioned above, Equations 1 and 4 are not satisfied, and frp21=frp22.

As illustrated in FIG. 8, the acoustic wave filter according to Comparative Example 2 differs from the acoustic wave filter 10 according to the present preferred embodiment in that frp21=frp22. As a result, the stop band ($BW_{ATT2}$) near the lower side of the pass band is narrower than the corresponding stop band ($BW_{ATT1}$) of the acoustic wave filter 10 according to the present preferred embodiment. This makes it impossible to provide sufficient attenuation in the WLAN pass band.

The following describes how acoustic wave filters according to preferred embodiments of the present invention are effective in improving the steepness of the transition region between the pass band and the stop band on the lower side of the pass band.

Figure 9:
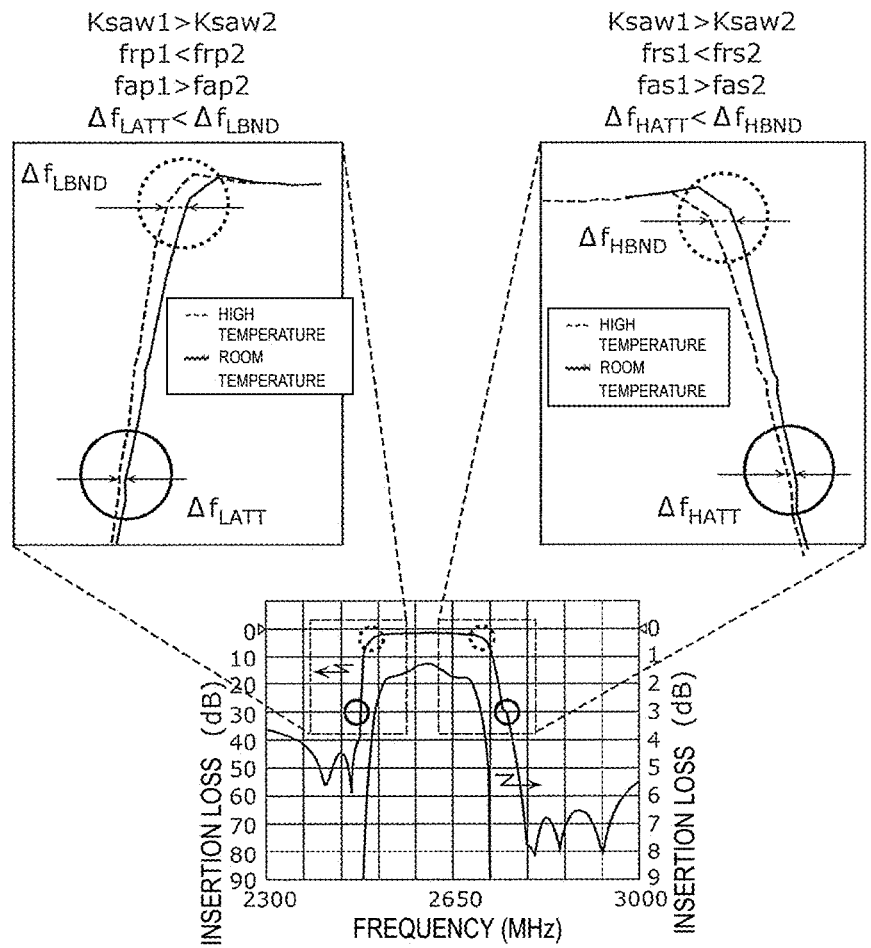
FIG. 9 illustrates graphs comparing temperature characteristics on the lower side of the pass band with temperature characteristics on the higher side of the pass band.

FIG. 9 illustrates graphs comparing temperature characteristics on the lower side of the pass band with temperature characteristics on the higher side of the pass band. FIG. 9 depicts the bandpass characteristics of a ladder surface acoustic wave filter (lower middle in FIG. 9), the bandpass characteristics on the lower side of the pass band (upper left in FIG. 9), and the bandpass characteristics on the higher side of the pass band (upper right in FIG. 9).

Generally, an acoustic wave filter including surface acoustic wave resonators has bandpass characteristics such that frequency varies with changes in temperature. At temperatures below room temperature, the bandpass characteristics shift upward in frequency, and at temperatures above room temperature, the bandpass characteristics shift downward in frequency.

If the effective electromechanical coupling coefficient of a surface acoustic wave resonator is adjusted by a dielectric layer provided between the substrate 101 and the IDT electrode, frequency shifts due to temperature changes are reduced than if no such dielectric layer is provided. In other words, the thicker the dielectric layer, the lower the temperature coefficient of frequency (TCF). That is, according to the present preferred embodiment, the parallel-arm resonator 22 has a lower temperature coefficient of frequency (TCF) than the parallel-arm resonator 21.

Each resonator experiences a rise in temperature upon application of a radio frequency signal. For this reason, it is particularly important to reduce or minimize deterioration of filter characteristics at higher temperatures. In this regard, under high temperature condition, the lower end of the pass band shifts in a direction that increases the pass band width. By contrast, under high temperature condition, the above-mentioned transition region on the lower side of the pass band shifts in a direction that narrows the stop band. Therefore, a factor causing deterioration of filter characteristics under high temperature condition is the frequency shift in the above-mentioned transition region on the lower side of the pass band. According to the present preferred embodiment, the amount of temperature-induced shift ($\Delta f_{LBND}$) at the lower end of the pass band under high temperature condition is determined by the temperature coefficients of frequency of all the parallel-arm resonators 21 to 24 of the acoustic wave filter 10. By contrast, the amount of temperature-induced shift ($\Delta f_{LATT}$) in the above-mentioned transition region on the lower side of the pass band under high temperature condition is determined by the temperature coefficient of frequency of the parallel-arm resonator 22. Hence, the amount of temperature-induced shift ($\Delta f_{LATT}$) is less than the amount of temperature-induced shift ($\Delta f_{LBND}$). Consequently, as illustrated in FIG. 9 (upper left), the steepness of the above-mentioned transition region under high temperature condition does not deteriorate in comparison to the steepness under room temperature condition. In other words, deterioration of attenuation characteristics in the above-mentioned transition region is able to be reduced or minimized without deteriorating the bandpass characteristics at the lower end of the pass band under high temperature condition.

One conceivable way to improve the steepness of the transition region on the higher side of the pass band would be to employ an acoustic wave resonator according to a comparative example described below. This acoustic wave resonator includes a plurality of series-arm resonators designed to satisfy Equations 6 to 10 below.

$fas11$(anti-resonant frequency of the series-arm resonator11)>$fas12$(anti-resonant frequency of the series-arm resonator12)   (Eq. 6)

$frs11$(resonant frequency of the series-arm resonator 11)>$frs12$(resonant frequency of the series-arm resonator12)   Eq. 7

$$Ksaw11(Ksaw \text{ of the series-arm resonator} 11) > Ksaw2 \\ (Ksaw \text{ of the series-arm resonator} 12) \quad \text{(Eq. 8)}$$

$$fas12 < fas11, fas13, fas14, fas15 \quad \text{(Eq. 9)}$$

film thickness of the dielectric layer of the series-arm resonator12 > film thickness of the dielectric layer of the series-arm resonator11 (Eq. 10)

In the acoustic wave filter according to the comparative example, the higher end of the pass band shifts in a direction that narrows the pass band width under high temperature condition. By contrast, the transition region on the higher side of the pass band shifts in a direction that increases the width of the stop band under high temperature condition. Therefore, a factor causing deterioration of filter characteristics under high temperature condition is the frequency shift at the higher end of the pass band. According to the present comparative example, the amount of temperature-induced shift ($\Delta f_{HBND}$) at the higher end of the pass band under high temperature condition is determined by the temperature coefficients of frequency of all the series-arm resonators 11 to 15 of the acoustic wave filter. By contrast, the amount of temperature-induced shift ($\Delta f_{HATT}$) in the transition region on the higher side of the pass band under high temperature condition is determined by the temperature coefficient of frequency of the series-arm resonator 12. Hence, the amount of temperature-induced shift ($\Delta f_{HATT}$) is less than the amount of temperature-induced shift ($\Delta f_{HBND}$). Consequently, as illustrated in FIG. 9 (upper right), the steepness of the above-mentioned transition region under high temperature condition deteriorates in comparison to the steepness under room temperature condition. Therefore, the configuration of the acoustic wave filter according to the above-mentioned comparative example results in deterioration of bandpass characteristics at the higher end of the pass band under high temperature condition.

As described above, the acoustic wave filter 10 according to the present preferred embodiment includes a plurality of parallel-arm resonators designed to satisfy Equations 1 to 4. As a result, deterioration of bandpass characteristics in the pass band, and deterioration of attenuation characteristics in the low-side transition region are able to be reduced under a high temperature condition in which a radio frequency signal is applied.

Adjusting the film thickness of the dielectric layer between the substrate 101 and the IDT electrode, or the film thickness of the protective layer disposed over the IDT electrode has been described above as a method for adjusting the effective electromechanical coupling coefficient Ksaw of each of the parallel-arm resonators 21 to 24 in the acoustic wave filter 10 according to the present preferred embodiment. As modifications of the above-mentioned method, other methods for adjusting the effective electromechanical coupling coefficient Ksaw will be described below.

Figure 10A:
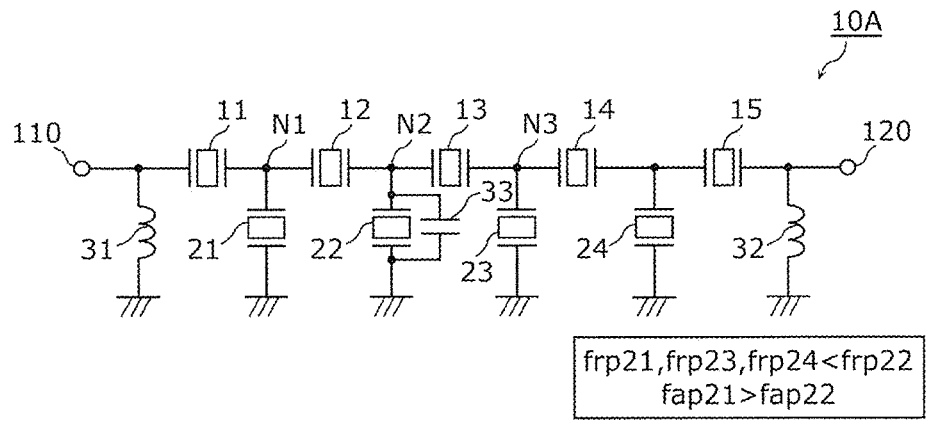
FIG. 10A illustrates the circuit configuration of an acoustic wave filter according to Modification 1 of a preferred embodiment of the present invention.

FIG. 10A illustrates the circuit configuration of an acoustic wave filter 10A according to Modification 1 of the present preferred embodiment. The acoustic wave filter 10A according to Modification 1 differs from the acoustic wave filter 10 according to the present preferred embodiment in that the thickness of the dielectric layer is the same between the parallel-arm resonators 21 to 24, and that a capacitive element is connected in parallel with the parallel-arm resonator 22. The following description of the acoustic wave filter 10A according to Modification 1 will mainly focus on differences from the acoustic wave filter 10, and features identical to those of the acoustic wave filter 10 will not be described in further detail.

The acoustic wave filter 10A includes the series-arm resonators 11 to 15, the parallel-arm resonators 21 to 24, the inductors 31 and 32, a capacitor 33, and the input/output terminals 110 and 120. The acoustic wave filter 10A satisfies all of Equations 1 to 4 mentioned above.

The film thickness of the dielectric layer provided between the substrate 101 and the IDT electrode, and the film thickness of the dielectric layer provided over the IDT electrode are the same between the parallel-arm resonators 21 to 24.

The capacitor 33 is connected in parallel with the parallel-arm resonator 22. As a result of the above-mentioned configuration, the effective electromechanical coupling coefficient Ksaw22 of the parallel-arm resonator 22 is lower than the effective electromechanical coupling coefficient Ksaw21 of the parallel-arm resonator 21, and Equation 3 mentioned above is thus satisfied.

The capacitor 33 may include a comb electrode.

Figure 10B:
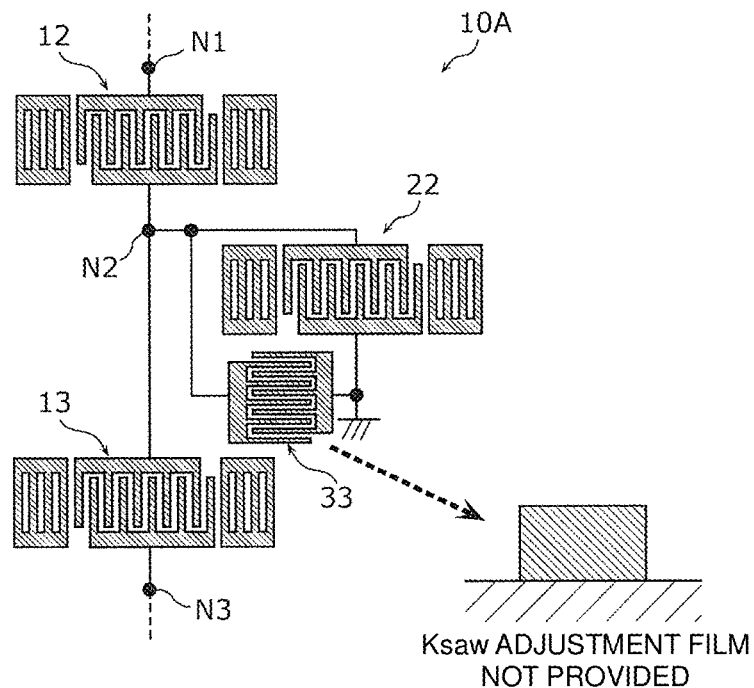
FIG. 10B illustrates a plan of the layout of some electrodes of the acoustic wave filter according to Modification 1 of a preferred embodiment of the present invention, and a cross-section of a comb capacitor electrode.

FIG. 10B illustrates a plan of the layout of some electrodes of the acoustic wave filter 10A according to Modification 1 of the present preferred embodiment, and a cross-section of an electrode of the capacitor 33. As illustrated in FIG. 10B, the capacitor 33 may include a comb electrode disposed on the substrate 101 (piezoelectric body), with no dielectric layer to adjust the effective electromechanical coupling coefficient being provided between the substrate 101 and the comb electrode. A dielectric layer made of a material such as $SiO_2$ has a dielectric constant less than the dielectric constant of the substrate 101 (piezoelectric body). According to the above-mentioned configuration, it is possible to provide a large capacitance per unit area of the capacitor 33 due to the absence of a dielectric layer between the capacitor 33 and the substrate 101 (piezoelectric body). The capacitor 33 is thus able to be reduced in size, leading to miniaturization of the acoustic wave filter 10A.

The plurality of electrode fingers of the above-mentioned comb electrode may extend in the direction of acoustic wave propagation, and may be arranged periodically in a direction perpendicular or substantially perpendicular to the direction of propagation.

With the acoustic wave filter 10A according to Modification 1, the resonant band width of the parallel-arm resonator 22 is smaller than the resonant band width of the parallel-arm resonator 21. Further, the acoustic wave filter 10A satisfies Equations 1, 2, and 4. This makes it possible to achieve a wider pass band, a wider stop band on the lower side of the pass band, and improved steepness of the above-mentioned transition region.

Figure 10C:
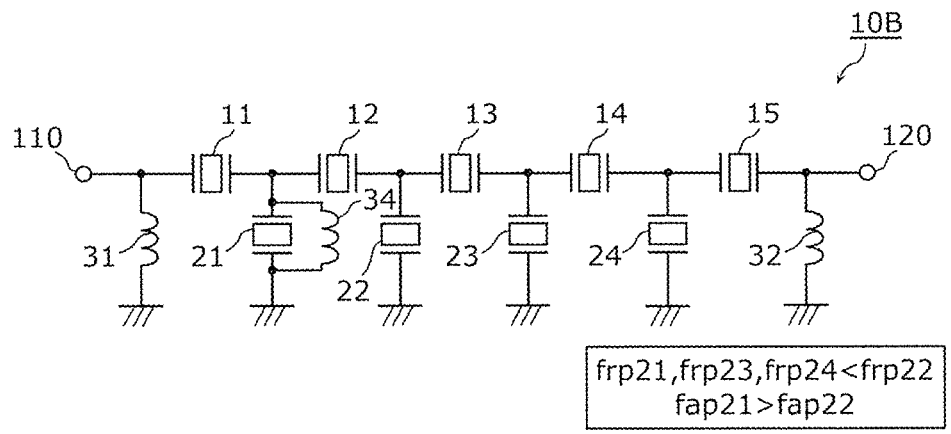
FIG. 10C illustrates the circuit configuration of an acoustic wave filter according to Modification 2 of a preferred embodiment of the present invention.

FIG. 10C illustrates the circuit configuration of an acoustic wave filter 10B according to Modification 2 of the present preferred embodiment. The acoustic wave filter 10B according to Modification 2 differs from the acoustic wave filter 10 according to the present preferred embodiment in that the thickness of the dielectric layer is the same between the parallel-arm resonators 21 to 24, and that an inductive element is connected in parallel with the parallel-arm resonator 21. The following description of the acoustic wave filter 10B according to Modification 2 will mainly focus on differences from the acoustic wave filter 10, and features identical to those of the acoustic wave filter 10 will not be described in further detail.

The acoustic wave filter 10B includes the series-arm resonators 11 to 15, the parallel-arm resonators 21 to 24, the inductors 31 and 32, an inductor 34, and the input/output terminals 110 and 120. The acoustic wave filter 10B satisfies all of Equations 1 to 4 mentioned above.

The film thickness of the dielectric layer provided between the substrate 101 and the IDT electrode, and the film thickness of the dielectric layer provided over the IDT electrode are the same between the parallel-arm resonators 21 to 24.

The inductor 34 is connected in parallel with the parallel-arm resonator 21. As a result of the above-mentioned configuration, the effective electromechanical coupling coefficient Ksaw21 of the parallel-arm resonator 21 is higher than the effective electromechanical coupling coefficient Ksaw22 of the parallel-arm resonator 22, and Equation 3 mentioned above is thus satisfied.

With the acoustic wave filter 10B according to Modification 2, the resonant band width of the parallel-arm resonator 21 is greater than the resonant band width of the parallel-arm resonator 22. Further, the acoustic wave filter 10B satisfies Equations 1, 2, and 4. This makes it possible to achieve a wider pass band, a wider stop band on the lower side of the pass band, and improved steepness of the above-mentioned transition region.

Further, an acoustic wave filter 10C according to Modification 3 differs from the acoustic wave filter 10 according to the present preferred embodiment in that the thickness of the dielectric layer is the same between the parallel-arm resonators 21 to 24, and that the comb electrode of the IDT electrode of the parallel-arm resonator 22 is a thinned electrode. The following description of the acoustic wave filter 10C according to Modification 3 will mainly focus on differences from the acoustic wave filter 10, and features identical to those of the acoustic wave filter 10 will not be described in further.

The acoustic wave filter 10C includes the series-arm resonators 11 to 15, the parallel-arm resonators 21 to 24, the inductors 31 and 32, and the input/output terminals 110 and 120. The acoustic wave filter 10C satisfies all of Equations 1 to 4 mentioned above.

The comb electrodes 200a and 200b of the IDT electrode 200 of the parallel-arm resonator 22 have a thinned electrode structure. As a result, the effective electromechanical coupling coefficient Ksaw22 of the parallel-arm resonator 22 is lower than the effective electromechanical coupling coefficient Ksaw21 of the parallel-arm resonator 21, and Equation 3 mentioned above is thus satisfied.

With the acoustic wave filter 10C according to Modification 3, the resonant band width of the parallel-arm resonator 22 is smaller than the resonant band width of the parallel-arm resonator 21. Further, the acoustic wave filter 10C satisfies Equations 1, 2, and 4. This makes it possible to achieve a wider pass band, a wider stop band on the lower side of the pass band, and improved steepness of the above-mentioned transition region.

Although acoustic wave filters according to preferred embodiments of the present invention have been described, the present invention is not limited to the above preferred embodiments. The present invention is intended to encompass other preferred embodiments achieved by combining given components in the above preferred embodiments, modifications obtained by modifying the above preferred embodiments in various ways as may become apparent to one skilled in the art without departing from the scope of the present invention, and the acoustic wave filters according to preferred embodiments of the present invention.

For example, the acoustic wave filters according to preferred embodiments of the present invention are not limited to a surface acoustic wave filter. Alternatively, an acoustic wave filter may be an acoustic wave filter device including series-arm and parallel-arm resonators and utilizing a boundary acoustic wave or a bulk acoustic wave (BAW). This configuration also provides the same effect as that of the surface acoustic wave filters according to each of the above preferred embodiments.

In another exemplary configuration, in an acoustic wave filter, an inductor or capacitor may be connected between individual components. The inductor may include an interconnect inductor due to an interconnect line connecting individual components with each other.

Preferred embodiments of the present invention are applicable to a wide variety of communication apparatuses such as cellular phones, as a wideband acoustic wave filter with enhanced attenuation characteristics at low frequencies.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
   a first input/output terminal and a second input/output terminal to which a radio frequency signal is input or from which a radio frequency signal is output;
   a first series-arm resonator and a second series-arm resonator each including an acoustic wave resonator and disposed on a path that connects the first input/output terminal with the second input/output terminal;
   a first parallel-arm resonator disposed on a path that connects a first node with ground, the first node being located on a path that connects the first series-arm resonator with the first input/output terminal;
   a second parallel-arm resonator disposed on a path that connects a second node with ground, the second node being located on a path that connects the first series-arm resonator with the second series-arm resonator; and
   a third parallel-arm resonator disposed on a path that connects a third node with ground, the third node being located on a path that connects the second series-arm resonator with the second input/output terminal; wherein
   the first parallel-arm resonator has a resonant frequency lower than a resonant frequency of the second parallel-arm resonator;
   the third parallel-arm resonator has a resonant frequency lower than the resonant frequency of the second parallel-arm resonator;
   the first parallel-arm resonator has an anti-resonant frequency higher than an anti-resonant frequency of the second parallel-arm resonator;
   the resonant frequency of the second parallel-arm resonator is highest of all parallel-arm resonators of the acoustic wave filter device; and
   the resonant frequency of the third parallel-arm resonator is closer to the resonant frequency of the second parallel-arm resonator than the resonant frequency of the first parallel-arm resonator.

2. The acoustic wave filter device according to claim 1, wherein the second parallel-arm resonator has an effective electromechanical coupling coefficient that is lowest of all parallel-arm resonators of the acoustic wave filter device.

3. The acoustic wave filter device according to claim 1, wherein the first parallel-arm resonator has an effective electromechanical coupling coefficient that is highest of all parallel-arm resonators of the acoustic wave filter device.

4. The acoustic wave filter device according to claim 1, wherein the acoustic wave filter device comprises in total at least two series-arm resonators including the first series-arm resonator and the second series-arm resonator, and at least three parallel-arm resonators including the first, second, and third parallel-arm resonators.

5. The acoustic wave filter device according to claim 4, wherein the at least two series-arm resonators and the at least three parallel-arm resonators each comprise a surface acoustic wave resonator.

6. The acoustic wave filter device according to claim 4, wherein each of the at least two series-arm resonators includes at least two acoustic wave resonators divided in series.

7. The acoustic wave filter device according to claim 4, wherein each of the first and second parallel-arm resonators includes at least two acoustic wave resonators divided in series.

8. The acoustic wave filter device according to claim 1, wherein
the first parallel-arm resonator and the second parallel-arm resonator each include at least a piezoelectric body and an IDT electrode;
the second parallel-arm resonator further includes a second dielectric layer that adjusts an effective electromechanical coupling coefficient, the second dielectric layer being provided between the piezoelectric and the IDT electrode; and
a dielectric layer that adjusts an effective electromechanical coupling coefficient is not provided between the piezoelectric body and the IDT electrode of the first parallel-arm resonator, or a first dielectric layer that adjusts an effective electromechanical coupling coefficient is provided between the piezoelectric body and the IDT electrode of the first parallel-arm resonator, the first dielectric layer being thinner than the second dielectric layer.

9. The acoustic wave filter device according to claim 1, wherein
the first parallel-arm resonator and the second parallel-arm resonator each include at least a piezoelectric body and an IDT electrode;
the second parallel-arm resonator further includes a fourth dielectric layer that adjusts an effective electromechanical coupling coefficient and covers the IDT electrode; and
a dielectric layer that adjusts an effective electromechanical coupling coefficient is not disposed over the IDT electrode of the first parallel-arm resonator, or a third dielectric layer that adjusts an effective electromechanical coupling coefficient is disposed to cover the IDT electrode of the first parallel-arm resonator, the third dielectric layer being thinner than the fourth dielectric layer.

10. The acoustic wave filter device according to claim 1, further comprising a capacitor connected in parallel with the second parallel-arm resonator.

11. The acoustic wave filter device according to claim 10, wherein
the capacitor includes a comb electrode disposed on a piezoelectric body; and
a dielectric layer that adjusts an effective electromechanical coupling coefficient is not provided between the piezoelectric and the comb electrode.

12. The acoustic wave filter device according to claim 1, further comprising an inductor connected in parallel with the first parallel-arm resonator.

13. The acoustic wave filter device according to claim 1, wherein
the second parallel-arm resonator includes a piezoelectric body and an IDT electrode; and
a comb electrode of the IDT electrode includes a thinned electrode.

14. The acoustic wave filter device according to claim 1, wherein the acoustic wave filter device filters radio frequency signals used in the Long Term Evolution standard.

15. The acoustic wave filter device according to claim 1, further comprising a third series-arm resonator.

16. The acoustic wave filter device according to claim 1, further comprising a third series-arm resonator, a fourth series-arm resonator, and a fifth series-arm resonator.

17. The acoustic wave filter device according to claim 1, further comprising a fourth parallel-arm resonator.

18. The acoustic wave filter device according to claim 1, further comprising a first inductor and a second inductor.

19. The acoustic wave filter device according to claim 18, wherein the first inductor and the second inductor perform impedance matching.

20. The acoustic wave filter device according to claim 1, further comprising a longitudinally coupled resonator.

* * * * *